(12) United States Patent
Lommasson

(10) Patent No.: US 6,391,171 B1
(45) Date of Patent: May 21, 2002

(54) FLANGELESS FEED THROUGH

(75) Inventor: Timothy C. Lommasson, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 579 days.

(21) Appl. No.: 08/848,759

(22) Filed: May 1, 1997

(51) Int. Cl.$^7$ .................. C23C 14/34; C23C 16/00; C23F 1/02

(52) U.S. Cl. ............... 204/298.08; 118/723 I; 118/723 IR; 156/345; 204/298.06; 439/805; 439/920; 439/363; 174/68.3; 174/138 A

(58) Field of Search ............ 204/298.02, 298.06, 204/298.08; 118/723 I, 723 IR; 156/345, 345 C; 439/805, 920, 363; 174/68.3, 138 A

(56) References Cited

U.S. PATENT DOCUMENTS

| | | | | |
|---|---|---|---|---|
| 3,927,355 A | * | 12/1975 | Parker | .................. 317/100 |
| 4,509,233 A | * | 4/1985 | Shaw | .................. 24/136 R |
| 4,519,579 A | * | 5/1985 | Brestel et al. | ............... 251/172 |
| 5,439,575 A | * | 8/1995 | Thornton et al. | ...... 204/192.25 |
| 5,772,473 A | * | 6/1998 | Cheng et al. | ............... 439/621 |

* cited by examiner

Primary Examiner—Steven H. VerSteeg
(74) Attorney, Agent, or Firm—Moser, Patterson & Sheridan, LLP

(57) ABSTRACT

A flangeless feed through supplies power to a device through a passage in a wall of a vacuum chamber. The feed through includes an insulator ring securely positioned in the passage, a first threaded insert, and a second threaded insert which engages the first threaded insert, wherein the insulator ring is gripped by the first and second threaded inserts. The feed through is installed by securely positioning the insulator ring within the passage, inserting the first threaded insert into the passage, and then connecting the first and second threaded inserts to grip the insulator ring.

13 Claims, 3 Drawing Sheets

FLANGELESS FEED THROUGH

FIELD OF THE INVENTION

The present invention relates to connection of a power source to a device within a vacuum chamber. More particularly, the invention relates to a feed through which seals within a passage through a wall of a semiconductor processing chamber.

BACKGROUND OF THE RELATED ART

Connecting a power source, such as a radio frequency ("RF") power source, to a device, such as an RF antenna coil, through the wall of a vacuum chamber typically involves a flanged feed through which is mounted within a passage through the wall. The flange is generally fastened to the wall of the chamber and an insulated conductor which is fixed to the flange links the external power source to the internal device.

Flanged feed throughs typically are installed prior to complete assembly of the internal device inside the vacuum chamber and prior to assembly of some chamber components such as deposition shields. The flanged feed throughs are not easily replaced without disassembly of the internal device and any components installed within the vacuum chamber after installing the feed through. There is a need for a flangeless feed through for connecting a power source to a device through a passage in a wall of a vacuum chamber wherein the feed through can be easily installed within the passage after assembly of the device and other chamber components.

SUMMARY OF THE INVENTION

The present invention provides a flangeless feed through which supplies power to a device through a passage in a wall of a vacuum chamber. The feed through includes an insulator ring securely positioned in the passage, a first threaded insert, and a second threaded insert which engages the first threaded insert, wherein the insulator ring is gripped by the first and second threaded inserts. The feed through is installed in a fully assembled vacuum chamber by securely positioning the insulator ring within the passage, inserting the first threaded insert into the passage, and then connecting the first and second threaded inserts to grip the insulator ring.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings. The appended drawings illustrate typical embodiments of this invention and are not to be considered limiting of its scope, for the invention may admit to other equally effective embodiments.

DETAILED DESCRIPTION OF THE INVENTION

Figure 1:
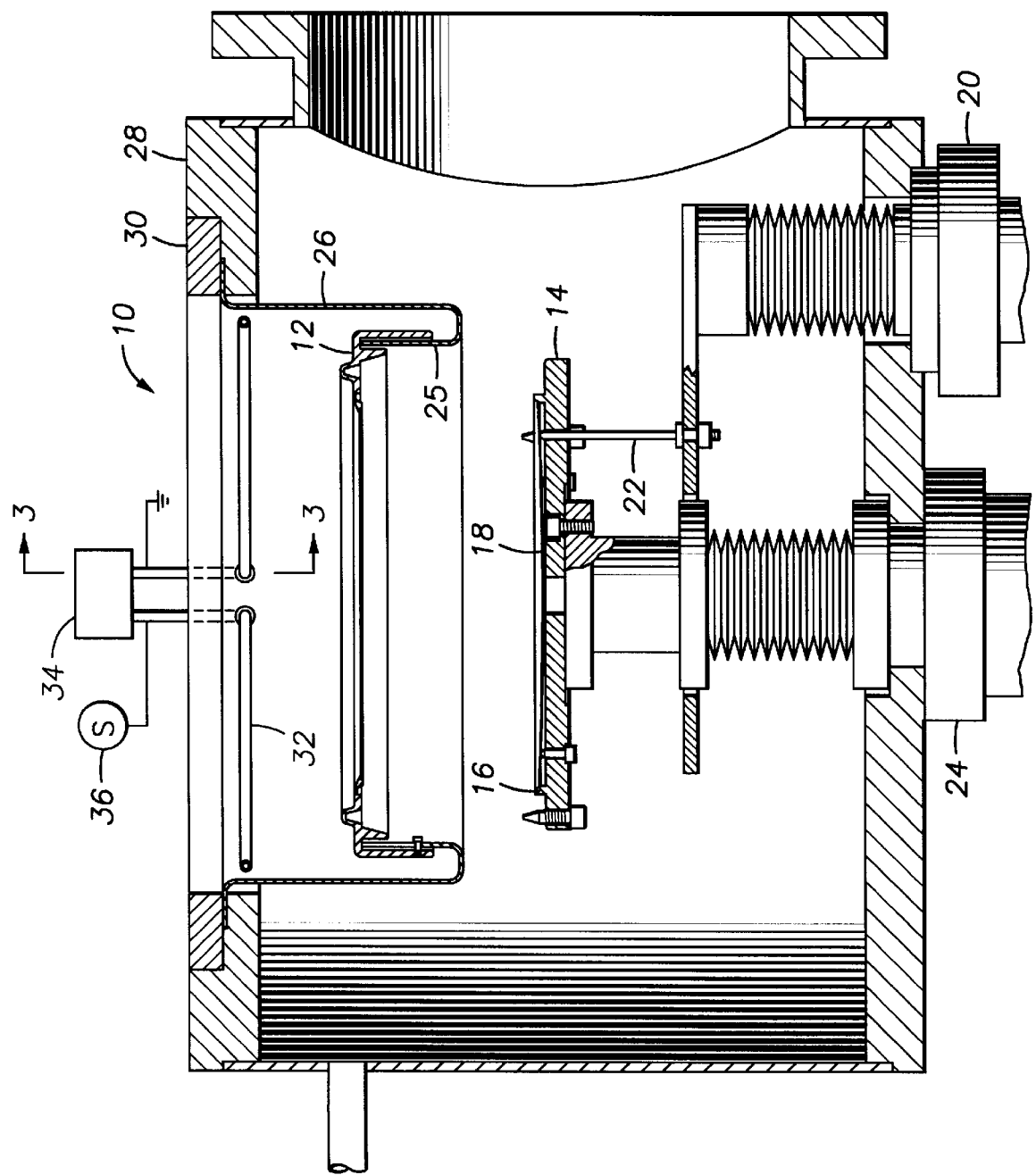
FIG. 1 is a sectional view of a vacuum deposition chamber (without a target assembly) showing an external RF power source connected to a RF antenna coil by two flangeless feed throughs.

The present invention provides a flangeless feed through for supplying power to a device through a passage in a wall of a vacuum chamber without welds or fasteners connecting a flange to the wall. The feed through preferably insulates a conductive material within the passage and preferably seals the passage so that low pressures can be maintained in the vacuum chamber. The feed through will typically connect the device to an external power source or to an external ground. Two feed throughs can be used to connect a device within the vacuum chamber to both an external power source and an external ground. The feed throughs are most useful in supplying RF or DC power to an electrode within the vacuum chamber.

The feed through comprises an insulator ring securely positioned in the passage through the wall of the vacuum chamber, a first threaded insert, and a second threaded insert which engages the first threaded insert, wherein the insulator ring is gripped by the first and second threaded inserts. The insulator ring is preferably gripped within a channel formed when the second threaded insert engages the first threaded insert. The insulator ring is preferably a ceramic such as alumina, aluminum nitride, or boron nitride. The first and second threaded inserts are preferably conductive tubes which can transport both a fluid such as cooling water and electrical power through the device within the vacuum chamber.

The insulator ring is preferably secured within the passage in the wall by a retaining nut which is installed from out side the vacuum chamber. The retaining nut is preferably an insulator such as a ceramic or a high performance plastic such as G-10 plastic which is a fiber-reinforced plastic available from Ryerson. The retaining nut could be a conductive metal if an insulator tube isolates the conductive threaded inserts from the retaining nut. Additional insulator tubes can also be used as needed to isolate the threaded inserts from the walls of the vacuum chamber.

The flangeless feed throughs are especially useful for transmitting RF or DC power to an electrode within a high vacuum semiconductor processing chamber such as the VECTRA® IMP chambers available from Applied Materials, Inc. of Santa Clara, Calif. The high vacuum chambers are used for physical vapor deposition (PVD) of Aluminum, Titanium, Copper, Tantalum, or Titanium Nitride layers to form conductors or barrier layers on semiconductor wafers. One or more VECTRA® IMP chambers are typically mounted on a semiconductor processing platform such as the CENTURA® platform and ENDURA® platforms manufactured by Applied Materials, Inc.

The invention is further described by reference to a specific flangeless feed through shown in the drawings. The feed through supplies RF power and cooling water to an RF antenna coil through a passage in a wall of a semiconductor processing chamber. However, the feed through components of the invention are readily transferred to supplying power to other devices within a vacuum chamber such as an electrode within a substrate support member.

As shown in FIG. 1, the present invention relates to a useful method and apparatus for processing a substrate in a semiconductor processing chamber 10. The processing chamber 10 typically includes a clamp ring 12 and a support member 14 disposed in the processing chamber 10, and a substrate alignment member 16 located on the support member 14. The substrate alignment member 16 aligns a substrate 18 with the support member 14 under gravity feed as the substrate is received on the support member 14. A substrate lift mechanism 20 moves pins 22 to receive the substrate prior to processing in the chamber. A support lift mechanism 24 raises the support member 14 so that the support member 14 picks up the substrate 18 off the pins 22 prior to processing in the chamber, or lowers the support member 14 to place the substrate on the pins 22 for removal of the substrate after processing.

Figure 2:
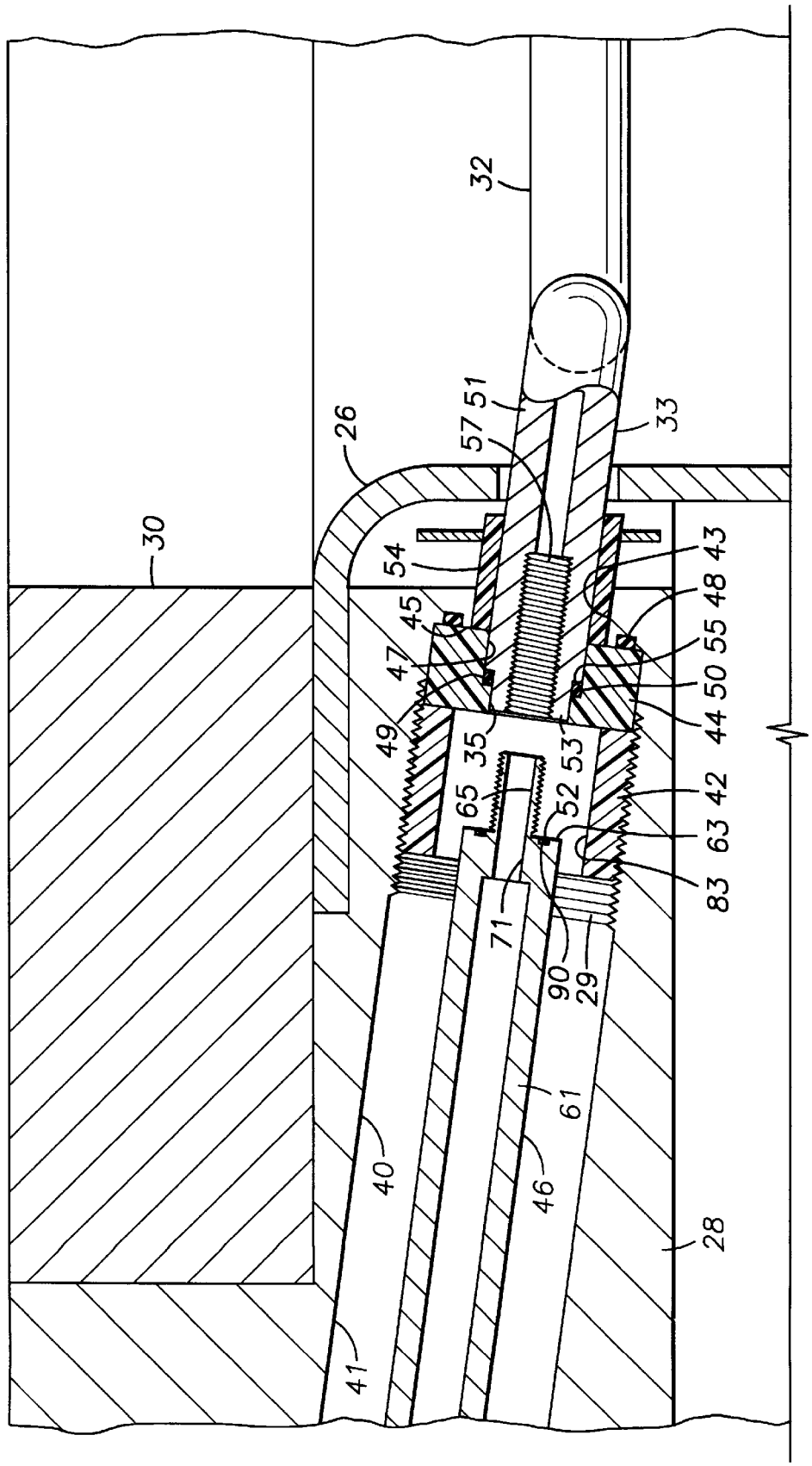
FIG. 2 is a sectional view of a partially assembled flangeless feed through which supplies RF power to the RF antenna of FIG. 1.
Figure 3:
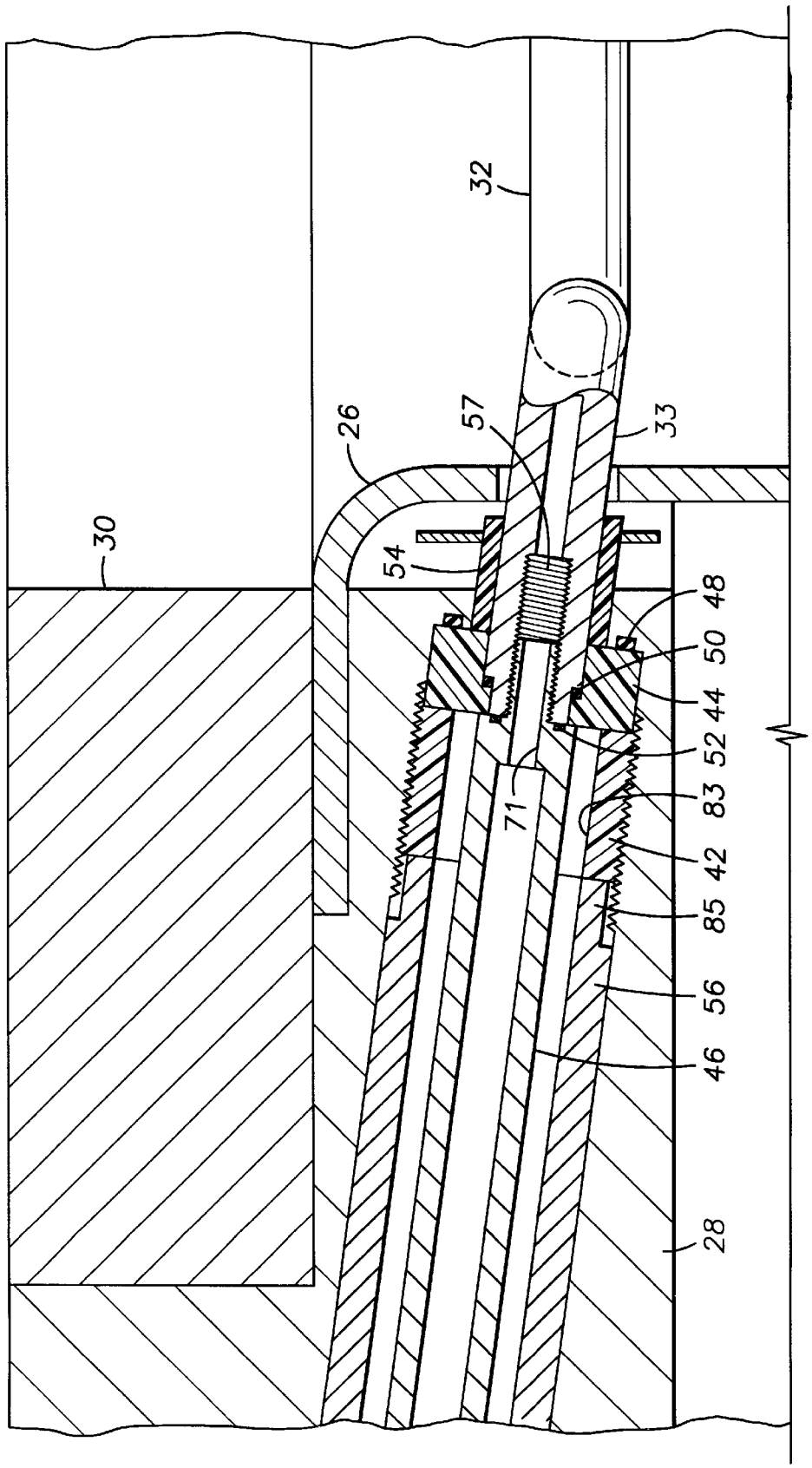
FIG. 3 is a sectional view of the assembled flangeless feed through of FIG. 2.

As the support member 14 continues moving upward in the chamber 10, the support member 14 passes into the clamp ring 12 which rests upon an inner cylindrical portion 25 of a deposition shield 26. An aluminum adapter 28 supports the deposition shield 26 and an insulator 30. The adapter 28 is a wall of the vacuum chamber and has passages for installation of a water cooled RF antenna coil 32 through two identical flangeless feed throughs of the present invention. The feed throughs are constructed as shown in FIGS. 2 and 3 which are described below. The antenna coil 32 circulates cooling water from a cooling water supply system 34. An external RF power source 36 supplies RF power to one end of the antenna coil 32 and the other end of the antenna coil 32 is externally grounded.

The coil 32 is supported within the chamber on a plurality of standoffs (not shown). The coil 32 is supplied with power to enable a gas, maintained at a vacuum pressure level in the chamber, to be energized into a plasma, and is further supplied with coolant to flow therethrough to enable cooling of the coil 32 to remove heat created therein as the power passes through the coil 32.

Referring now generally to FIGS. 2 and 3, there is shown the preferred embodiment of the flangeless feed through of the present invention. In the specific use of the feed through shown, it is used to supply power and a coolant to a coil 32, maintained in vacuum, and a power and coolant supply, maintained in ambient conditions.

To enable passage of the RF, or other, power to the coil 32, conductive elements must extend through the chamber wall, but they cannot contact the chamber wall which may be grounded, or, if contacted with the conductor, will become "hot." To provide this configuration, the feed through is extended though a passage 40 in the adaptor, which passage 40 serves as a conduit between ambient conditions outside the chamber and vacuum conditions in the chamber. The feed through includes an insulator ring 44 received in the passage 40 which serves to insulate the conductive elements of the feed through from the adaptor 28. Preferably, in order to secure the positioning of the insulator ring 44 in the passage 40, the passage 44 includes internal threads 29 and an insulative retaining element, such as a retaining nut 42, is threaded into the passage over threads 29 to secure ring 44 in position. Preferably, as shown in the figures, passage 40 includes a first bore 41 opening into ambient condition and a second bore 43 opening into the chamber condition, having a generally right circular ledge 45 separating them. When the nut 42 is fully seated in threads 29, it presses the ring 44 against the ledge 45.

The conductive elements of the feed through include a first threaded insert 33 which is an end of the RF antenna coil 32. The first threaded insert 33 extends from internally of the chamber through the second bore 43 in the passage 40 and into a bore 35 in the ring 44 locked in the first bore 41 of passage 40. Preferably, the bore 35 in ring 44 includes a major diameter portion 47 opening to the vacuum side of passage 40, and a minor diameter portion opening to the ambient side of the feed through, wherein the portions are separated by an insulator ledge 49 which also preferably has a right, circular, profile. Likewise, the first threaded insert 33 includes a major diameter portion 51 and a minor diameter distal end 53, wherein the portion 51 and the distal end 53 are separated by a ledge 55. Additionally, the distal end 53 of the first insert 33 includes an internally threaded bore 57 extending inwardly thereof When inserted into the bore 35 of the ring 44, ledge 55 engages an O-ring 50 or other seal which is compressed until the ledge 55 engages the insulator ledge 49, thereby limiting the extent of entry of the insert 33 inwardly of the passage 40. To prevent arcing between the first threaded insert 33 and adjacent conductive portions of the chamber, an insulative sleeve 54 is located over that portion of the major diameter portion 51 extending inwardly of the chamber from the insulator ring 44.

A second threaded insert 46 is configured to extend inwardly of the first bore 41 of passage 40 and through a bore 83 in the retaining nut 42, and sealingly and securely engage the first threaded insert 33. To provide these features, the second threaded insert 46 is preferably configured from a conductor such as copper, and it includes a first tubular portion 61 terminating in an engagement face 63, from which a tubular threaded portion 65 extends. To interconnect the first threaded insert 33 and the second threaded insert 46, the threaded portion 65 of the second threaded insert is received and tightened into the threaded bore 57 of the first threaded insert. A bore 71, extending through the second threaded insert 46 is thus aligned with the threaded bore 57 of the first threaded insert, thereby enabling fluid communication therethrough. To prevent arcing between the second insert 46 and the passage 40, an insulative sleeve 56 is inserted in the passage 40, preferably before second insert 46 is secured into the passage. A reduced diameter portion 85 of the sleeve 56 enables the sleeve to extend into the threads 29 of the passage 40 and engage the retaining nut 42.

The threaded engagement of the two inserts 33, 46 enables the feed of electrical power through the feed through. However, to pass a fluid therethrough, and to ensure vacuum integrity of the feed through, the passage 40 and the bores in the inserts 33, 46 must be sealed. Referring again to FIGS. 2 and 3, sealing is accomplished by providing a seal ring bore 90 inwardly of engagement face 63 and an o-ring 52 or other seal is located therein. When the second insert 46 is fully threaded into first insert 33, this seal is compressed by the distal end 53 of the first insert 33 surrounding the bore therethrough, thereby creating a seal about the interface of the two inserts' bores. To provide vacuum sealing of the passage 40, the O-ring seal 50 is located intermediate the ledges 55, 49 of the ring 44 and first insert 33, and a seal is 48 is located between the ring 44 and the ledge 45 of the passage 40.

The structure of the feed through provides a simple means of extending fluid and power inwardly of a vacuum chamber, which is easily serviced and takes up a minimum of space. Additionally, the configuration of threaded insulative and conductive. members centers the conductive pieces, specifically the first and second inserts 33, 46, within other conductive pieces, specifically the walls of passage 40, thereby minimizing the likelihood of a contact between such conductive members leading to shorting to ground or powering of unintended exposed chamber parts. Additionally, in the preferred embodiment, the first threaded insert 33 may be a continuous extension of the coil 32 as shown, or, it may terminate inwardly of the chamber where it is connected to a chamber element. Where the first element 33 is a continuation of the coil 32, it can serve as either end of the coil 32, to allow cooling fluid to flow through the coil, and exit the other end of the coil 32. Further, the bores of the inserts 33, 46 may be used to pass gases, or other conduits such as wires, therethrough.

The feed through shown in FIGS. 2 and 3 does not have a flange which typically adds impedance to the feed through.

The feed through also uses face-to-face O-ring seals between metal and ceramic components and does not require metal/ceramic brazed connections. The feed through is conveniently installed in a fully assembled vacuum chamber by securely positioning the insulator ring 44 within the passage 40, inserting the fully assembled RF antenna coil 32 into the passage 40 until the first threaded insert 33 rests against the insulator ring 44, and then connecting the first and second threaded inserts 33, 46 to grip the insulator ring 44. The second threaded insert 46 is connected to the cooling water supply system 34 and the external RF power source 36 to supply both cooling water and RF power to the RF antenna coil 32.

While the foregoing is directed to the preferred embodiment of the present invention, other and further embodiments of the invention may be devised without departing from the basic scope thereof. The scope of the invention is determined by the claims which follow.

What is claimed is:

1. A flangeless feed through for supplying power to a device through a passage in a wall of a vacuum chamber, the feed through comprising:
    an insulator ring securely positioned in the passage;
    a first threaded insert; and
    a second threaded insert which engages the first threaded insert;
    wherein the insulator ring is gripped by the first and second threaded inserts.

2. The feed through of claim 1, wherein the insulator ring is securely positioned in the passage by a retaining nut.

3. The feed through of claim 1, wherein the first and second threaded inserts are tubes.

4. The feed through of claim 1, further comprising an insulator tube which isolates one of the threaded inserts from the wall of the chamber.

5. A flangeless feed through for supplying power to a device within a vacuum chamber, comprising:
    a wall comprising a passage, a receiving surface within the passage, and internal threads within the passage;
    a retaining nut comprising external threads which engage the internal threads of the wall;
    an insulator ring which is securely positioned against the receiving surface by the retaining nut;
    a first threaded insert connected to the device; and
    a second threaded insert which engages the first threaded insert to supply power to the device;
    wherein the insulator ring is gripped by the first and second threaded inserts.

6. The feed through of claim 5, wherein the first and second threaded inserts are tubes.

7. The feed through of claim 6, further comprising an insulator tube which isolates one of the threaded inserts from the wall of the chamber.

8. The feed through of claim 7, wherein the wall defines a processing chamber in a semiconductor processing platform.

9. The feed through of claim 8, wherein the insulator ring is gripped when the first threaded insert engages the second threaded insert.

10. A flangeless feed through for a vacuum processing chamber, comprising:
    a chamber wall comprising a passage, a receiving surface within the passage, and internal threads within the passage;
    a retaining nut comprising external threads which engage the internal threads of the wall;
    an insulator ring which is securely positioned against the receiving surface by the retaining nut;
    an RF antenna coil comprising a first threaded insert; and
    a second threaded insert engaging the first threaded insert within the passage to supply RF power to the antenna coil;
    wherein the first and second threaded inserts grip the insulator ring.

11. The feed through of claim 10, wherein the first and second threaded inserts are tubes.

12. The feed through of claim 11, further comprising an insulator tube which isolates one of the threaded inserts from the wall of the chamber.

13. The feed through of claim 12, wherein the insulator ring is gripped when the first threaded insert engages the second threaded insert.

* * * * *

UNITED STATES PATENT AND TRADEMARK OFFICE
CERTIFICATE OF CORRECTION

PATENT NO.    : 6,391,171 B1                                      Page 1 of 1
DATED         : May 21, 2002
INVENTOR(S)   : Lommasson It is certified that error appears in the above-identified patent and that said Letters Patent is hereby corrected as shown below:

Column 3,
Line 39, please change "extended though" to -- extended through --.

Column 4,
Line 3, please change "thereofWhen" to -- thereof. When --.

Signed and Sealed this

Twenty-fourth Day of June, 2003

JAMES E. ROGAN
*Director of the United States Patent and Trademark Office*